(12) United States Patent
Leu et al.

(10) Patent No.: US 11,004,659 B2
(45) Date of Patent: May 11, 2021

(54) AMORPHOUS CARBON THIN FILM, MANUFACTURING METHOD THEREOF AND OPTICAL SYSTEM INCLUDING THE SAME

(71) Applicant: NATIONAL CHIAO TUNG UNIVERSITY, Hsinchu (TW)

(72) Inventors: Jih-Perng Leu, Taipei (TW); Jui-Min Chang, Taipei (TW)

(73) Assignee: National Chiao Tung University, Hsinchu (TW)

( * ) Notice: Subject to any disclaimer, the term of this patent is extended or adjusted under 35 U.S.C. 154(b) by 360 days.

(21) Appl. No.: 16/055,627

(22) Filed: Aug. 6, 2018

(65) Prior Publication Data
US 2019/0122862 A1   Apr. 25, 2019

(30) Foreign Application Priority Data
Oct. 24, 2017  (TW) ................. 106136513

(51) Int. Cl.
| | |
|---|---|
| *C23C 16/26* | (2006.01) |
| *H01J 37/32* | (2006.01) |
| *G02B 5/28* | (2006.01) |
| *C23C 16/34* | (2006.01) |
| *C23C 16/509* | (2006.01) |
| *G02C 7/10* | (2006.01) |

(52) U.S. Cl.
CPC ........ *H01J 37/32082* (2013.01); *C23C 16/26* (2013.01); *C23C 16/347* (2013.01); *C23C 16/509* (2013.01); *G02B 5/287* (2013.01); *G02C 7/107* (2013.01); *H01J 2237/3321* (2013.01)

(58) Field of Classification Search
CPC ......... C23C 16/26; C23C 16/34; C23C 16/36; C23C 16/42; C23C 16/455; C23C 16/505; C23C 16/347; C23C 16/509; G02C 7/10; G02C 7/107; H01J 37/32; H01J 2237/3321; H01J 37/32082; C07C 255/50; C07F 7/21; G02B 5/28; G02B 5/22; G02B 5/287; G02B 5/20; B32B 27/06; B32B 9/00
See application file for complete search history.

(56) References Cited

U.S. PATENT DOCUMENTS

| | | | | |
|---|---|---|---|---|
| 2006/0014397 | A1* | 1/2006 | Seamons | ........... H01L 21/02115 438/778 |
| 2007/0286965 | A1* | 12/2007 | Seamons | ............. C23C 16/4404 427/569 |
| 2010/0093187 | A1* | 4/2010 | Lee | ...................... H01L 21/3146 438/780 |
| 2013/0330482 | A1* | 12/2013 | Leu | ........................ C23C 16/345 427/579 |
| 2014/0030448 | A1* | 1/2014 | Bowen | .................... C23C 16/30 427/578 |
| 2017/0103893 | A1* | 4/2017 | Kulshreshtha | ...... H01L 21/0338 |
| 2017/0338109 | A1* | 11/2017 | Lei | ........................ C23C 16/401 |

* cited by examiner

*Primary Examiner* — Balram T Parbadia
(74) *Attorney, Agent, or Firm* — Muncy, Geissler, Olds & Lowe, P.C.

(57) ABSTRACT

A method of manufacturing an amorphous carbon thin film is provided. The method includes the following steps: providing a substrate in a reaction chamber; flowing a precursor and a carrier gas into the reaction chamber; and performing a PECVD method to deposit the amorphous carbon thin film on the substrate. Wherein, the precursor includes a compound having a C≡N functional group.

12 Claims, 10 Drawing Sheets

ABSCRIBE US 11,004,659 B2

AMORPHOUS CARBON THIN FILM, MANUFACTURING METHOD THEREOF AND OPTICAL SYSTEM INCLUDING THE SAME

CROSS-REFFERENCE TO RELATED APPLICATION

This application claims priority from Taiwan Patent Application No. 106136513, filed on Oct. 24, 2017 at Taiwan Intellectual Property Office, the contents of which are hereby incorporated by reference in their entirety for all purposes.

BACKGROUND OF THE INVENTION

1. Field of the Invention

The present invention is related to amorphous carbon thin films, the manufacturing method thereof and an optical system including the same, in particular, is related to a C≡N contained amorphous carbon thin film formed by a radio-frequency plasma-enhanced chemical vapor deposition (RF-PECVD) method, the manufacturing method thereof and an optical system including the same.

2. Description of the Related Art

Light can be classified into two categories, visible light and invisible light according to the wavelength of the light. Wherein, visible light is the wavelength range which is sensible by human eyes within the electromagnetic spectrum, and invisible light is the wavelength range excluding the range of the visible light, that is, the wavelength range insensible by human eyes. A normal human is able to sense the electromagnetic wavelength in a range of 400 nm to 700 nm. However, some people are able to sense the electromagnetic wavelength in a range of 380 nm to 780 nm. Human can feel various colors corresponding to the electromagnetic wavelength they sense. Briefly, the wavelength ranges may be briefly classified by the colors of red, orange, yellow, green, blue, indigo and violet.

In general, shorter wavelength indicates stronger energy and is typically more harmful to human eyes. Wherein, ultraviolet light is mostly absorbed by the cornea and the lentis. Hence, what actually affects the retina is blue light. The blue light having a wavelength in a range of 380 nm to 500 nm is also called "High energy visible (HEV)" blue light. Since HEV blue light contains relatively higher energy, it is more harmful to the human body, leaving the eyes dry and fatigued or even inducing lesions of retinal cells.

In recent years, with the development of semiconductor technology, many electronic products use light-emitting diodes or organic light-emitting diodes emitting blue light which has a wavelength in a range of 420 to 480 nm as a background light source, resulting in a great threat to the health of human eyes. As a result, a variety of anti-blue light screens have appeared on the market, hoping to protect the eyes by blocking blue light. However, the anti-blue light screen does not have a blocking efficiency more than about 40% against the blue light having the wavelength above 420 nm, such that it cannot effectively filter out the blue light and thus it is difficult to protect human eyes.

SUMMARY OF THE INVENTION

The inventor of the present invention solves the problem presented in the prior art by the preparation of a C=N contained amorphous carbon thin film and the utilization of the property in which the C=N bond has the highest absorbance at 300 nm during the n→π* transition. The present invention provides a C=N contained amorphous carbon thin film with outstanding properties, such as high transmittance in the wavelength range of visible and infrared light, friction resistance, chemical corrosion resistance and thermal conductivity, utilized as an anti-blue light film. The manufacturing method and use of the C=N contained amorphous carbon thin film are also provided.

A manufacturing method of the amorphous carbon thin film is provided in an aspect of the present invention, which includes the steps as follows: providing a substrate and a reaction chamber; flowing a precursor and a carrier gas into the reaction chamber; and performing a radio-frequency plasma-enhanced chemical vapor deposition method to deposit an amorphous carbon thin film on the substrate, wherein the precursor includes a compound having C=N functional group.

Preferably, the compound having C≡N functional group is a nitrile compound.

Preferably, the nitrile compound includes benzonitrile ($C_7H_5N$, PBN), acetonitrile ($C_2H_3N$), polybenzonitrile (PPBN), or malononitrile ($NCCH_2CN$).

Preferably, the precursor further includes 1,3,5-trimethyl-1,3,5-trivinyl-cyclotrisilazane (VSZ).

Preferably, the ratio of the compound having C≡N functional group and VSZ is about 1:1 to 1:4.

Preferably, the amorphous carbon thin film is deposited at about 50° C. to about 400° C.

Preferably, the substrate includes a glass or a polymer having a glass transition temperature of 50° C. to about 300° C.

Preferably, the polymer is selected form a group consisting of polyethylene, polymethyl methacrylate, polyethylene naphthalate, polyethersulfone, polycarbonate, polyimide, polyethylene terephthalate and any combination thereof.

An anti-blue light or blue light filtered thin film is provided as another aspect of the present invention, which is the amorphous carbon thin film made of the aforementioned method.

An optical system is provided as yet another aspect of the present invention, which includes the aforementioned anti-blue light or blue light filtered thin film, and the substrate.

Preferably, the polymer is selected from a group consisting of polyethylene, polymethyl methacrylate, polyethylene naphthalate, polyethersulfone, polycarbonate, polyimide, polyethylene terephthalate and any combination thereof.

Preferably, the substrate is a lens or a flexible substrate of a display device.

DESCRIPTION OF THE PREFERRED EMBODIMENTS

The present invention achieves the object of filtering out blue light and protecting human eyes by means of providing an amorphous carbon thin film as an anti-blue light film on a display apparatus which irradiates blue light or utilizes a device irradiating blue light as a backlight source.

The present invention is an amorphous carbon thin film formed by the RF-PECVD method. The properties of the amorphous carbon thin film may be different depending on the deposition method. In particular, the properties may be adjusted by modifying deposition conditions or substances sent into the chamber. The present invention further provides a manufacturing method of the amorphous carbon thin film, which obtains new types of amorphous by adjusting and modifying the precursors, ratios of the precursors, radio-frequency (RF) power, temperature, and pressure within the process of the RD-PECVD method.

Figure 1:
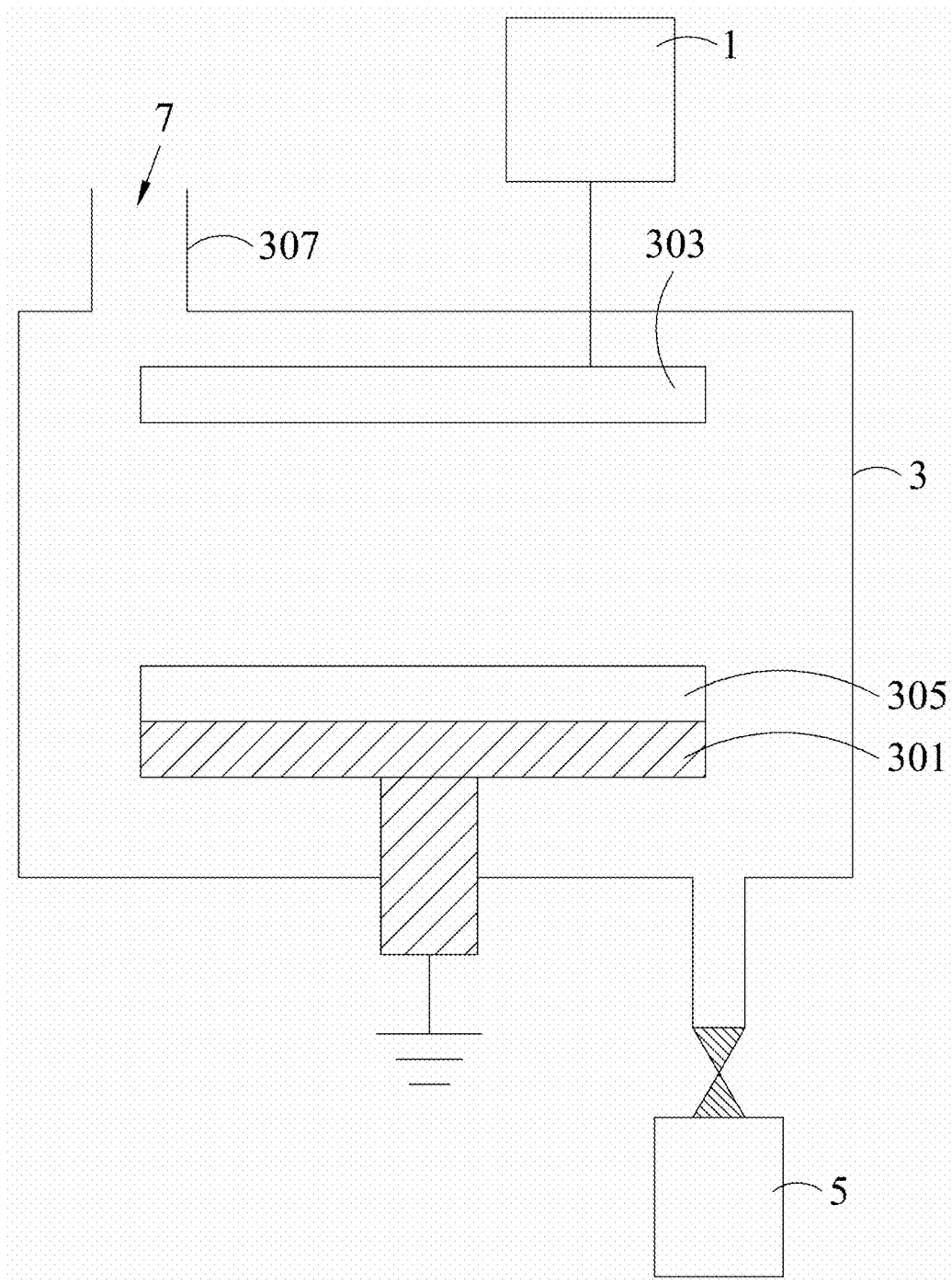
FIG. 1 illustrates a schematic diagram of a parallel plate PECVD system of an embodiment of the present invention.

FIG. 1 illustrates a schematic diagram of a parallel plate PECVD system of an embodiment of the present invention. Referring to FIG. 1, the shown parallel plate PECVD system includes a RF generator 1, a reaction chamber 3 and a vacuum pump 5. The reaction chamber 3 includes a heater 301, an upper electrode plate 303, a lower electrode plate 305 and a gas entrance 306, wherein the lower electrode plate 305 is disposed below the heater 301. The upper electrode plate 303 and the lower electrode plate 305 are parallel to and separated by a distance of 20 mm from each other, and each has a diameter of 150 mm.

Figure 2:
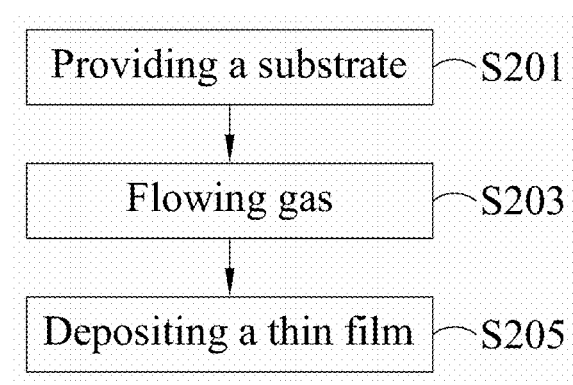
FIG. 2 illustrates a flow chart of manufacturing the amorphous carbon thin film by the system shown in FIG. 1 according to the present invention.

FIG. 2 illustrates a flow chart of manufacturing the amorphous carbon thin film by the system shown in FIG. 1 according to the present invention. The flow chart includes a step S201 of providing a substrate, a step S203 of flowing gas and a step S205 of depositing a thin film.

The step S201 which provides the substrate is to dispose the substrate on the lower electrode plate 305 within the reaction chamber 3. Wherein, the substrate may include glass or a polymer having a glass transition temperature (Tg) of about 50° C. to about 300° C. The polymer includes but is not limited to polyethylene, polymethyl methacrylate (PMMA), polyethylene naphthalate (PEN), polyethersulfone (PES), polycarbonate (PC), polyimide (PI), polyethylene terephthalate (PET) or any combination thereof. Preferably, the substrate may be polyethylene terephthalate having a glass transition temperature of 80° C. to about 105° C. In another embodiment, a step of cleaning the reaction chamber 3 by inert gas may be comprised prior to the step S201.

After completing the step S201, the step S203 which flows gas into the reaction chamber is performed. In the step S203, the gas 7 may flow into the reaction chamber 3 from the gas entrance 307 in which gas 7 may include a precursor and carrier gas. The precursor may include compounds having C≡N functional group. The carrier gas may be inert gas, including but not limited to $H_2$ or Ar, which does not react with the substrate and unit precursors. In a preferable embodiment, the precursor includes a nitrile compound including but not limited to, for instance, benzonitrile ($C_7H_5N$), acetonitrile ($C_2H_3N$), polybenzonitrile, or malononitrile ($NCCH_2CN$). Preferably, the precursor is benzonitrile. In an embodiment, the gas 7 includes the precursor and the carrier gas with a volume ratio of about 1:1 to 3:1.

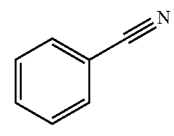
(Benzonitrile)

In another embodiment, except for the compound having C≡N functional group, the precursor further includes 1,3,5-trimethyl-1,3,5-trivinyl-cyclotrisilazane (VSZ) having the following structure:

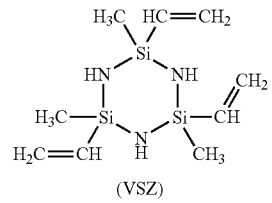
(VSZ)

When the precursor includes the compound having both C≡N functional group and VSZ, the deposited amorphous carbon thin film may be $SiC_xN_y$/carbon nitride, wherein the ratio of the compound having C≡N functional group and VSZ is about 1:1 to 1:4. When the accounting of the compound having C≡N group is too low, the formed amorphous carbon thin film may lack of the anti-blue light effect. Whereas, when the accounting of VSZ is too low, the mechanical strength of the amorphous carbon thin film may not be efficiently improved.

Finally, the step S205 of depositing the thin film is performed. According to an embodiment, in the step S205, the amorphous carbon thin film, may be deposited at about 50° C. to about 400° C. Preferably, the amorphous carbon thin film may be deposited at about 50° C. to about 250° C. More preferably, the amorphous carbon thin film may be deposited at about 50° C. to about 200° C. When the temperature is lower than 50° C., the mechanical strength of the formed amorphous carbon thin film may not be sufficient for practical use; when the temperature is higher than 400° C., the formed amorphous carbon thin film may immoderately reduce the transmittance of the visible light. In the step S205, the amorphous carbon thin film is deposited on the substrate by the RF-PECVD method, wherein the RF-PECVD method is a method that ionizes the gas 7 by the RF-generator 1 with 10 W to 90 w of RF power and generates plasma between the upper electrode plate 303 and the lower electrode plate 305, thereby depositing the amorphous carbon thin film on the substrate. Preferably, the used RF power is 50 W.

In an embodiment, in prior to performing the step S205 of depositing the thin film, the reaction chamber 3 shall be exhausted to almost vacuum by the vacuum pump 5. Preferably, the RF-PECVD is performed at a pressure condition of 1 Torr.

The present invention may further provide an anti-blue light or blue light filtered thin film, which is the amorphous thin film made of the aforementioned manufacturing method.

The present invention may further provide an optical system, which includes the aforementioned anti-blue light or blue light filtered thin film, and the substrate. In an embodiment, the substrate includes glass or a polymer having a glass transition temperature of about 50° C. to 300° C. The examples of the polymer may include but not limited to polyethylene, polymethyl methacrylate, polyethylene naphthalate, polyethersulfone, polycarbonate, polyimide, polyethylene terephthalate or any combination thereof. In an embodiment, the substrate may be a lens or a flexible substrate of a display device.

Figure 3:
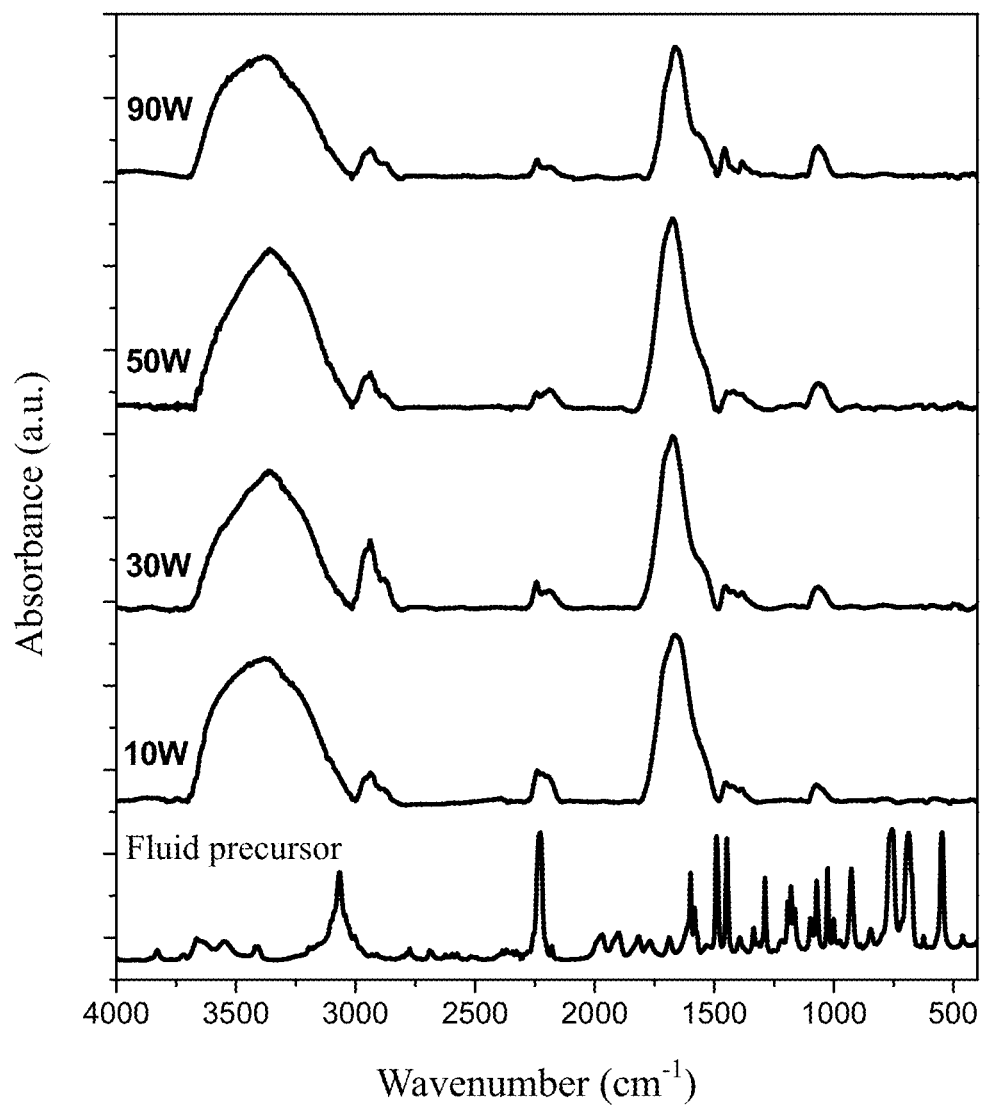
FIG. 3 illustrates the FT-IR spectrum of the amorphous carbon thin film made of the manufacturing method of an embodiment of the present invention.

FIG. 3 illustrates the FT-IR spectrum of the amorphous carbon thin film made of the manufacturing method of the present invention, in which the precursor is the compound having C≡N functional group and the deposition is performed at 50° C. with 10 W, 30 W, 50 W and 90 W of RF power.

According to FIG. 3, when the method of the present invention performs the deposition by utilizing the compound having C≡N functional group (2210-2260 $cm^{-1}$) as the precursor (only PBN is utilized as the precursor here), the absorbance band is reduced in a range of 2210-2260 $cm^{-1}$ which corresponding to the C≡N bond, that is, the C≡N bond is broken during deposition. On the other hand, according to the thin film deposited with 10 W, 30 W, 50 W and 90 W of RF power, the absorbance band can be observed in a range of 1615-1700 $cm^{-1}$ which corresponding to the C=N bond. Wherein, the absorbance band is the strongest at 50 W, which represents that the formulation efficiency of the C=N bond contained amorphous carbon thin film is the highest when depositing at 50 W. FIG. 3 may prove that the amorphous carbon thin film may be formed by utilizing the compound having C≡N functional group as the precursor according to the method of the present invention. In addition, the efficient is the best at 50 W of RF power.

The examples of manufacturing the amorphous carbon thin film with 50 W of RF power by the manufacturing method of the present invention are shown below.

Example 1

After the substrate is completely disposed, benzonitrile and argon are flown into the reaction chamber with flow rates of 20 sccm and 10 sccm respectively at the conditions of 1 Torr and 50° C. The RF-PECVD method is performed at 50 W of RF power in order to obtain the amorphous carbon thin film deposited on the substrate.

Example 2

Except for adjusting the temperature to 150° C. instead, the amorphous carbon thin film deposited on the substrate is obtained by the same parameter as the example 1.

Example 3

Except for adjusting the temperature to 200° C. instead, the amorphous carbon thin film deposited on the substrate is obtained by the same parameter as the example 1.

Example 4

Except for adjusting the temperature to 250° C. instead, the amorphous carbon thin film deposited on the substrate is obtained by the same parameter as the example 1.

Example 5

Except for adjusting the temperature to 300° C. instead, the amorphous carbon thin film deposited on the substrate is obtained by the same parameter as the example 1.

Example 6

Except for adjusting the temperature to 400° C. instead, the amorphous carbon thin film deposited on the substrate is obtained by the same parameter as the example 1.

Example 7

Except for adjusting the gas flown into the reaction chamber to VSZ, benzonitrile and argon with flowing rates of 20 sccm, 5 sccm and 10 sccm respectively instead, the amorphous carbon thin film deposited on the substrate is obtained by the same parameter as the example 4.

Example 8

Except for adjusting the gas flown into the reaction chamber to VSZ, benzonitrile and argon with flowing rates of 20 sccm, 10 sccm and 10 sccm respectively instead, the amorphous carbon thin film deposited on the substrate is obtained by the same parameter as the example 4.

Example 9

Except for adjusting the gas flown into the reaction chamber to VSZ, benzonitrile and argon with flowing rates of 20 sccm, 15 sccm and 10 sccm respectively instead, the amorphous carbon thin film deposited on the substrate is obtained by the same parameter as the example 4.

Comparative Example 1

Except for adjusting the gas flown into the reaction chamber to VSZ and argon with flowing rates of 20 sccm and 10 sccm respectively instead, the amorphous carbon thin film deposited on the substrate is obtained by the same parameter as the example 4.

Evaluation of the Properties of the Examples 1-9

Figure 4:
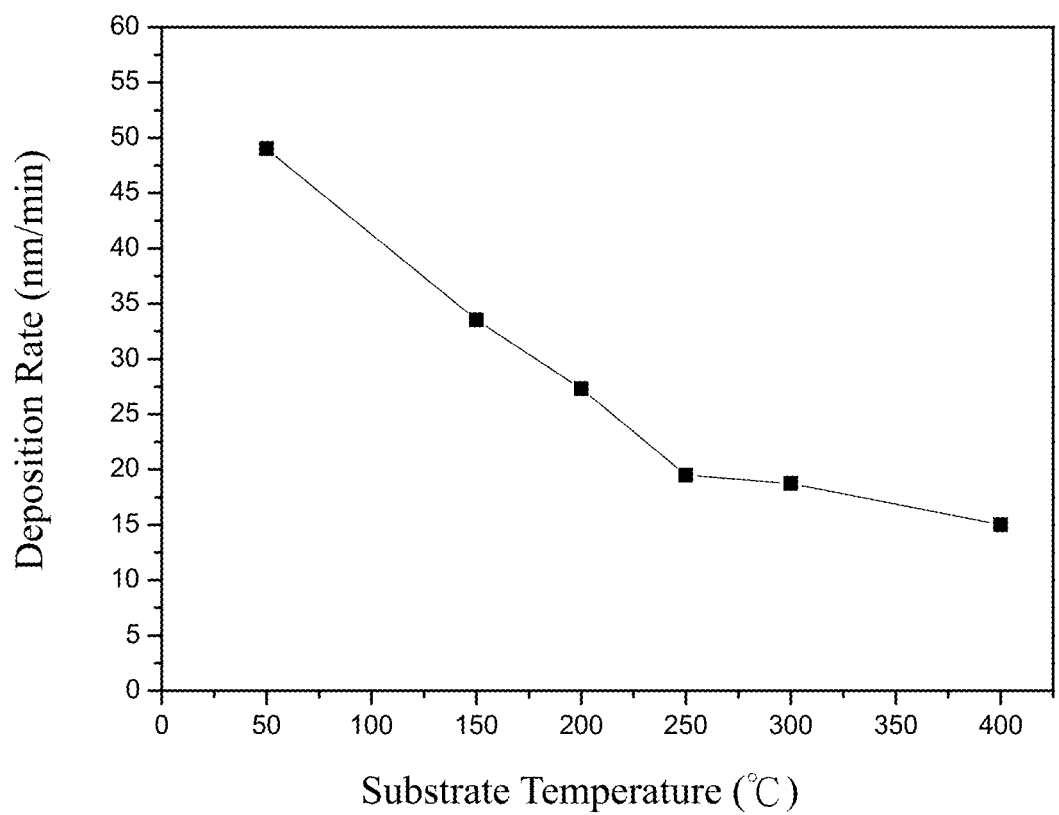
FIG. 4 illustrates a deposition rate vs. deposition temperature diagram.

FIG. 4 illustrates a deposition rate vs. deposition temperature diagram. According to FIG. 4, the deposition rate of the amorphous carbon thin film is reduced corresponding to increased temperature. Hence, according to the method of the present invention, the amorphous carbon thin film may be formed at a lower temperature such that the device or apparatus where the amorphous carbon thin film disposed or elements already formed on the device or apparatus may not be damaged.

Figure 5:
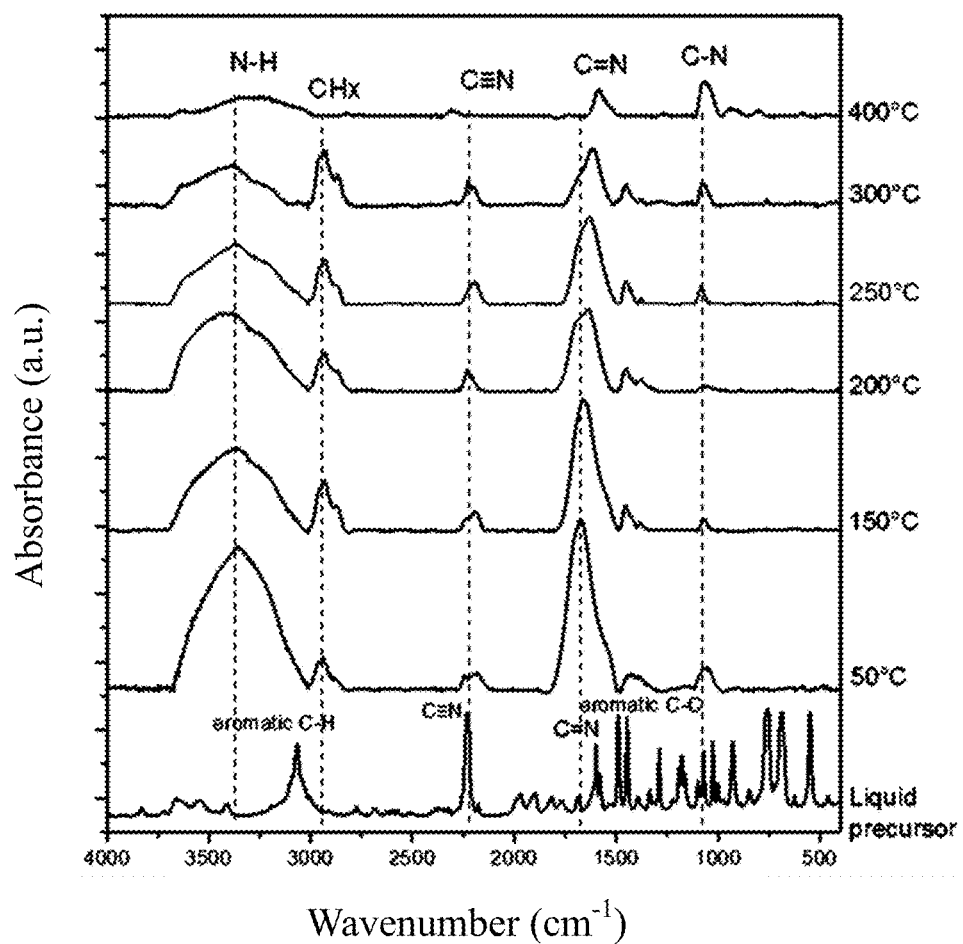
FIG. 5 illustrates the FT-IR spectrum of the amorphous carbon thin film made of the manufacturing method of an embodiment of the present invention.

FIG. 5 illustrates the FT-IR spectrum of the amorphous carbon thin film of the examples 1-6. According to FIG. 5, the absorbance band can be observed in a range corresponding to C=N bond from the results of examples 1-6. This indicates that the examples 1-6 are the C=N bond contained amorphous carbon thin film, and proves that the deposition performed in a range of about 50° C. to 400° C. may form the C=N bond contained amorphous carbon thin film.

Figure 6:
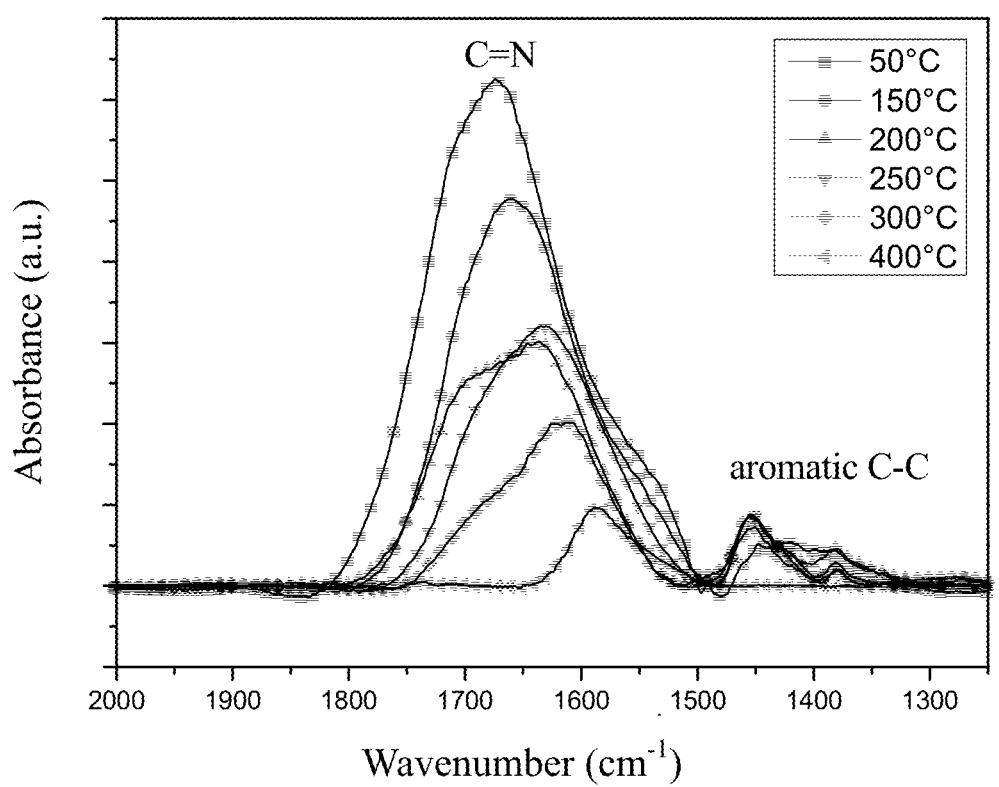
FIG. 6 illustrates the diagram comparing the C≡N bonds in each of the films of FIG. 5.

FIG. 6 illustrates the diagram comparing the C=N bonds in each of the films of the examples 1-6. According to FIGS. 5 and 6, the phenomenon that the C=N bond peak shifts to long wavelength area (i.e. red-shift) in the FT-IR spectrum red-shift is more obvious corresponding to the increased deposition temperature. Hence, excessively high deposition temperature may reduce the transmittance in a range of visible light. Thus, in order to provide the anti-blue light function and keep the transmittance in a range of visible light simultaneously, the deposition temperature is preferably maintained below about 400° C., most preferably below about 250° C.

Figure 7:
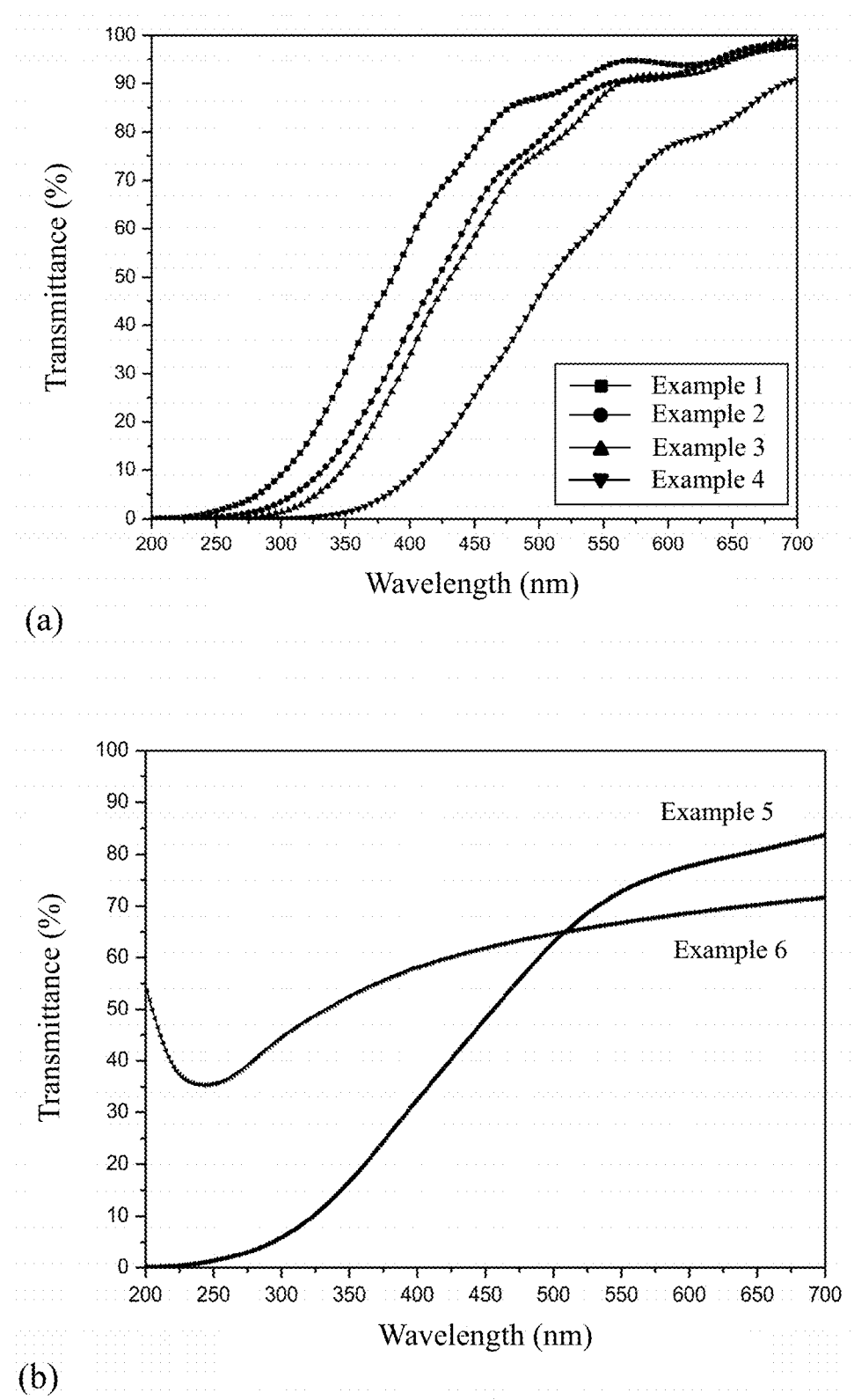
FIG. 7 illustrates a part (a) showing the transmittance of the embodiment of the present invention against the light of various wavelengths; and a part (b) showing the transmittance of another embodiment of the present invention against the light of various wavelengths.

The transmittance in a range of visible light of the examples 1-6 was measured by HITACHI U-3900H spectrometer. Part (a) of FIG. 7 shows the transmittance of the examples 1-4 against the light of various wavelengths. Part (b) of FIG. 7 shows the transmittance of the examples 5-6 against the light of various wavelengths. According to the part (a) of FIG. 7, the transmittance of the example 1 is higher than that of the example 2, the transmittance of the example 2 is higher than that of the example 3, and the transmittance of the example 3 is higher than that of the example 4. That is, when the deposition temperature is in a range of about 50° C. to 250° C., the transmittance of the deposited amorphous carbon thin film is decreased corresponding to the increase of the deposition temperature. Further, according to the part (b) of FIG. 7, the transmittance of the example 6 against the light having wavelength about 250 nm is specifically low, and the transmittance of the examples 5 and 7 against the light having wavelength of visible light is lower than that of the examples 1-4.

Figure 8:
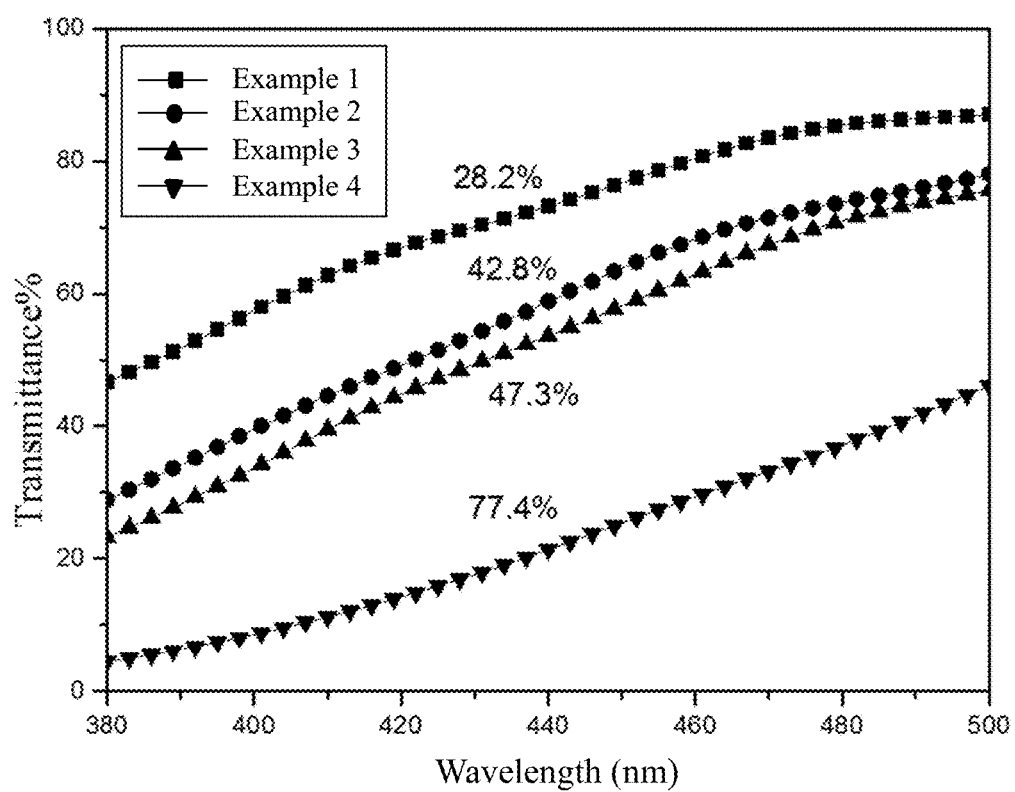
FIG. 8 illustrates the transmittance of blue light having the wavelength in a range of about 380 nm to 500 nm.

FIG. 8 illustrates the transmittance of blue light having the wavelength in a range of about 380 nm to 500 nm. According to the parts (a) and (b) of FIG. 7 and FIG. 8, the transmittance is classified into the blue light having wavelength in a range of 380 nm to 500 nm and the light having wavelength longer than 500 nm, which are shown in Table 1.

TABLE 1

|  | 380-500 nm Transmittance | 500-780 nm Transmittance |
| --- | --- | --- |
| Example 1 | 71.8% | 89.8% |
| Example 2 | 57.2% | 84.6% |
| Example 3 | 52.7% | 81.2% |
| Example 4 | 22.6% | 55.1% |

According to the above Table 1, when the light is irradiated to the examples 1 to 4, the blue light having the wavelength in a range of about 380 nm to 500 nm transmit through the example 1 by 71.8%, the example 2 by 57.2%, the example 3 by 52.7% and the example 4 by 22.6%. That is, the example 1 reduces 28.2% of blue light, the example 2 reduces 42.8% of blue light, the example 3 reduces 47.3% of blue light and the example 4 reduces 77.4% of blue light. Hence, it is proven that the amorphous carbon thin film of the present invention may reduce the transmittance of blue light and has the anti-blue light function.

Furthermore, since commercial white light LEDs often use blue light LEDs as light sources taken in conjunction with the fluorescent material emitting yellow light after excited by blue light, the anti-blue light function of the aforementioned examples performed in the LED light sources with 6000° K of color temperature is measured by PR-655 spectrometer and shown below.

Figure 9:
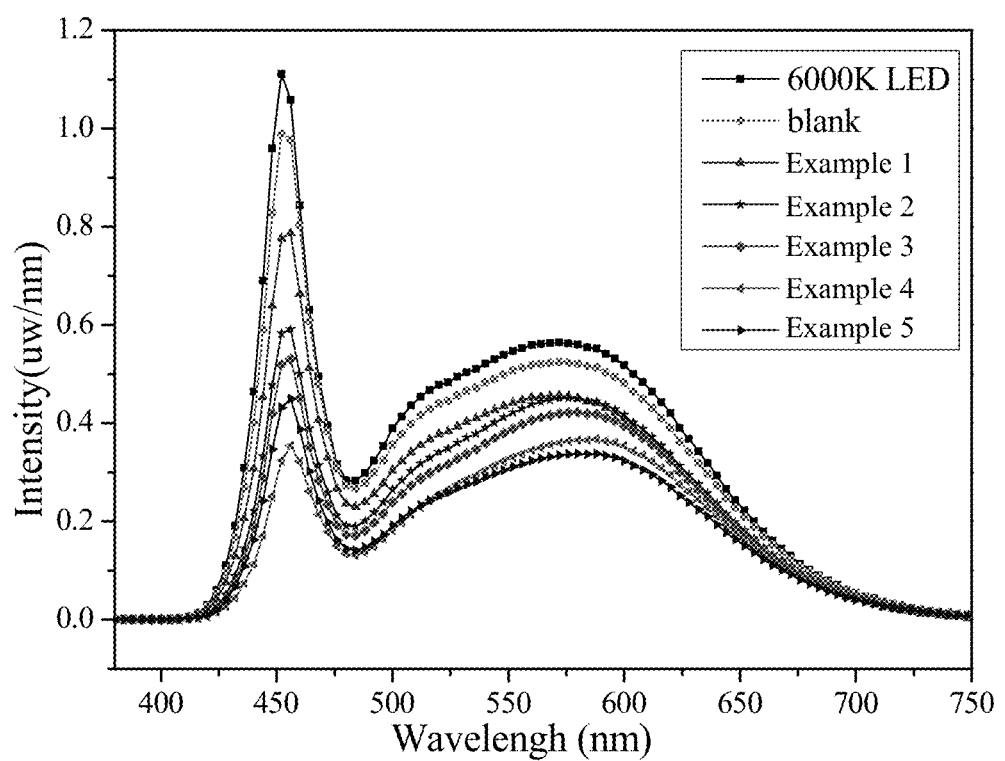
FIG. 9 illustrates the strength variety of light having various wavelengths after the embodiment of the present invention being placed on a LED light source with a color temperature of 6000° K.

FIG. 9 illustrates the strength variety of light having various wavelengths after the examples 1 to 5 being placed on a LED light source with a color temperature of 6000° K. Table 2 lists the variety of color temperature and the transmittance of the light having the wavelength in a range of 380 nm to 500 nm and the light having wavelength longer than 500 nm.

TABLE 2

|  | Color Temperature (°K) | 380-500 nm Transmittance | 500-780 nm Transmittance |
| --- | --- | --- | --- |
| Example 1 | 5773 | 18.5% | 85.2% |
| Example 2 | 4870 | 37.6% | 84.0% |
| Example 3 | 4692 | 44.3% | 80.0% |
| Example 4 | 4184 | 61.6% | 69.2% |

According to the Table 2, it shows that the examples 1 to 4 may not only reduce the color temperature and may also reduce the blue light transmittance efficiently.

Figure 10:
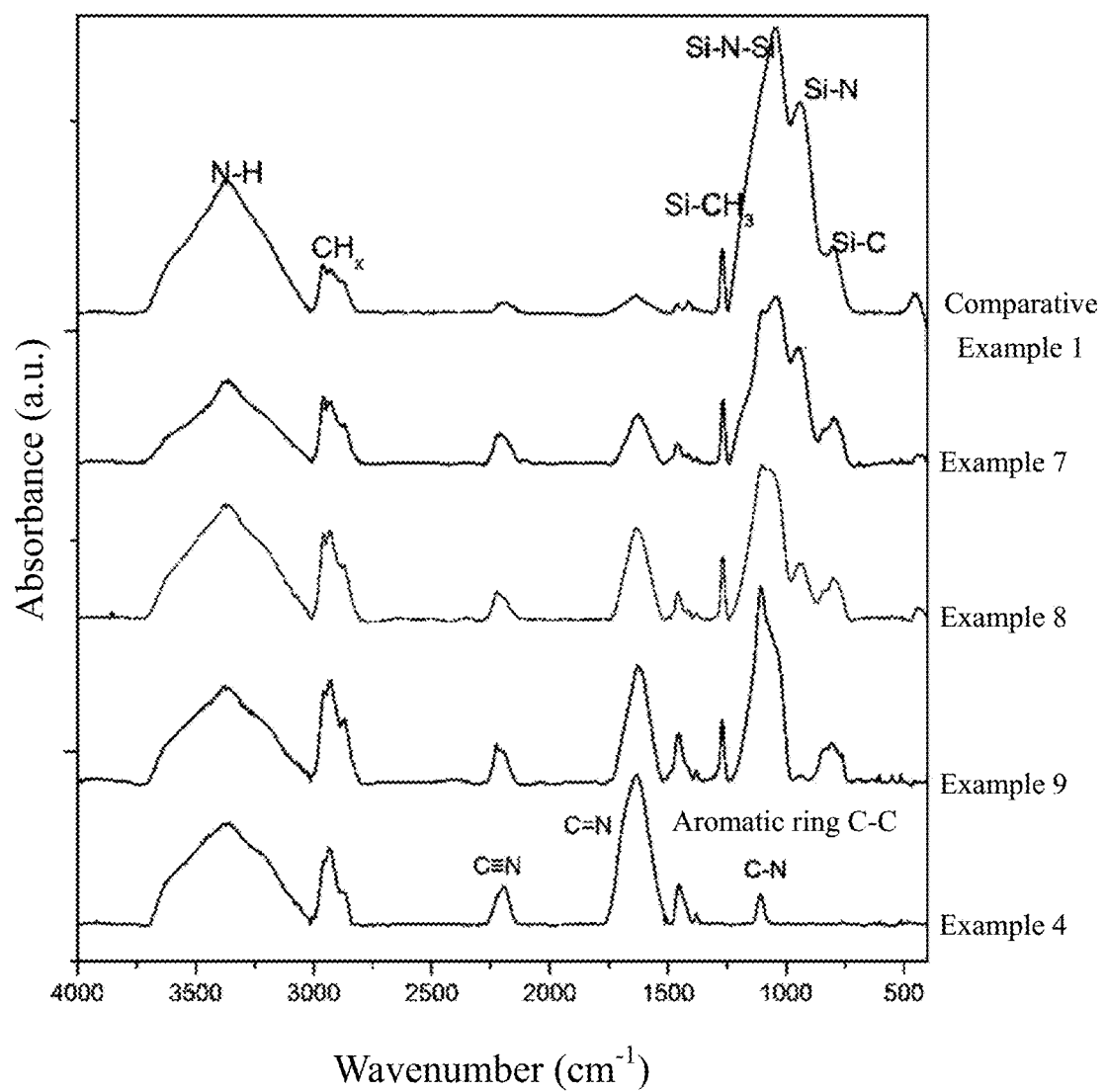
FIG. 10 illustrates the FT-IR spectrum of the amorphous carbon thin film made of the manufacturing method of yet another embodiment of the present invention.

FIG. 10 illustrates the FT-IR spectrums of the examples 4, 7 to 9 and the comparative example 1. According to FIG. 10, the comparative example 1 does not form the C=N bond which absorbs the light having wavelength of 300 nm. Further, the examples 7 to 9 form the Si—N bond which may improve the strength of the thin film. Hence, the examples 7 to 9 provide the amorphous carbon thin films with improved mechanical strength in comparison with the example 4.

As mentioned above, according to the manufacturing method of the amorphous carbon thin film provided by the present invention, a new type of amorphous carbon thin film may be provided, which is able to reduce the transmittance of blue light efficiently and reduce the color temperature, and further be formed at a low deposition temperature below 400° C. Hence, besides glass substrates, the amorphous carbon thin film of the present invention may also be formed on the flexible substrate including transparent resins such as PEN, PC, PMMA, PET and PI, in order to be formed such as a flexible electrical element or be able to be formed on a safety lens including transparent resins such as PC, thereby obtaining an anti-blue light lens.

The content of the embodiment described above is merely at least one of various implementations. A person skilled in the art is able to understand the core concept of the present invention after reading the content of above, and to modify the embodiments depending on requirements. In other words, the embodiments described above are not intended to limit the present invention. The scope protected by the present invention is defined by the appended claims.

What is claimed is:

1. A manufacturing method of an amorphous carbon thin film, comprising steps as follows:
    providing a substrate and a reaction chamber;
    flowing a precursor and a carrier gas into the reaction chamber, wherein the precursor comprises a compound having C≡N functional group and 1,3,5-trimethyl-1,3,5-trivinyl-cyclotrisilazane (VSZ) in a ratio of about 1:1 to 1:4; and
    performing a radio-frequency plasma-enhanced chemical vapor deposition method to deposit the amorphous carbon thin film on the substrate.

2. The manufacturing method of claim 1, wherein the compound having CEN functional group is a nitrile compound.

3. The manufacturing method of claim 2, wherein the nitrile compound comprises benzonitrile, acetonitrile, polybenzonitrile, or malononitrile.

4. The manufacturing method of claim 1, wherein the amorphous carbon thin film is deposited at about 50° C. to about 400° C.

5. The manufacturing method of claim 1, wherein the substrate comprises a glass or a polymer having a glass transition temperature of 50° C. to about 300° C.

6. The manufacturing method of claim 5, wherein the polymer is selected form a group consisting of polyethylene, polymethyl methacrylate, polyethylene naphthalate, polyethersulfone, polycarbonate, polyimide, polyethylene terephthalate and any combination thereof.

7. The manufacturing method of claim 6, wherein the polymer is the polyethylene terephthalate having a glass transition temperature of 80° C. to about 105° C.

8. An anti-blue light or blue light filtered thin film, which is the amorphous carbon thin film made of the manufacturing method of claim 1, wherein the amorphous carbon thin film has a deposition temperature of about 50° C. to about 400° C.

9. An optical system, comprising:
   the anti-blue light or blue light filtered thin film of claim 8; and
   a substrate, wherein the anti-blue light or blue light filtered thin film is disposed on the substrate.

10. The optical system of claim 9, wherein the substrate comprises a glass of a polymer having a glass transition temperature of about 50° C. to about 300° C.

11. The optical system of claim 10, wherein the polymer is selected from a group consisting of polyethylene, polymethyl methacrylate, polyethylene naphthalate, polyethersulfone, polycarbonate, polyimide, polyethylene terephthalate and any combination thereof.

12. The optical system of claim 9, wherein the substrate is a lens or a flexible substrate of a display device.

* * * * *